(12) United States Patent
Vanhoucke et al.

(10) Patent No.: US 10,930,747 B2
(45) Date of Patent: Feb. 23, 2021

(54) SEMICONDUCTOR DEVICE WITH AN ENCIRCLED ELECTRODE

(71) Applicant: NXP B.V., Eindhoven (NL)

(72) Inventors: Tony Vanhoucke, Bierbeek (BE); Mahmoud Shehab Mohammad Al-Sa'di, Kranenburg (DE)

(73) Assignee: NXP B.V., Eindhoven (NL)

(*) Notice: Subject to any disclaimer, the term of this patent is extended or adjusted under 35 U.S.C. 154(b) by 0 days.

(21) Appl. No.: 16/431,056

(22) Filed: Jun. 4, 2019

(65) Prior Publication Data

US 2020/0388687 A1 Dec. 10, 2020

(51) Int. Cl.
| H01L 29/06 | (2006.01) |
| H01L 29/417 | (2006.01) |
| H01L 29/868 | (2006.01) |

(52) U.S. Cl.
CPC ........ *H01L 29/417* (2013.01); *H01L 29/0692* (2013.01); *H01L 29/868* (2013.01)

(58) Field of Classification Search
CPC .. H01L 29/417; H01L 29/0692; H01L 29/868
USPC ........................................................ 257/656
See application file for complete search history.

(56) References Cited

U.S. PATENT DOCUMENTS

| 8,674,396 | B1* | 3/2014 | Wu | .................. | H01L 33/38 |
| | | | | | 257/98 |
| 2007/0200140 | A1 | 8/2007 | Kim | | |
| 2008/0080110 | A1 | 4/2008 | Arai et al. | | |
| 2008/0150080 | A1 | 6/2008 | Thiem et al. | | |
| 2011/0215358 | A1* | 9/2011 | Hwang | ................. | H01L 33/382 |
| | | | | | 257/98 |
| 2014/0110815 | A1 | 4/2014 | Lin et al. | | |
| 2016/0307939 | A1* | 10/2016 | Wang | .................... | H04B 10/40 |
| 2017/0221994 | A1 | 8/2017 | Al-Sa'Di et al. | | |
| 2017/0236975 | A1* | 8/2017 | Romano | ............... | H01L 33/025 |
| | | | | | 257/13 |
| 2018/0061821 | A1 | 3/2018 | Higashi | | |
| 2018/0097124 | A1 | 4/2018 | Chiou et al. | | |
| 2018/0218906 | A1 | 8/2018 | Al-Sa'Di et al. | | |
| 2018/0269286 | A1 | 9/2018 | Matsuura | | |

OTHER PUBLICATIONS

Sun, Pinping et al.; "A Novel SiGe PIN Diode SPST Switch for Broadband T/R Module;" Published in: IEEE Microwave and Wireless Components Letters (vol. 17 Issue: 5, May 2007 ); pp. 352-354; Date of Publication: Apr. 30, 2007 [DOI: 10.1109/LMWC.2007.895706].

* cited by examiner

*Primary Examiner* — Tong-Ho Kim
(74) *Attorney, Agent, or Firm* — Bruce M. Green

(57) ABSTRACT

An embodiment of a semiconductor device includes a first semiconductor region formed within a semiconductor substrate, a second semiconductor region formed within the semiconductor substrate, a first electrode coupled to the first semiconductor region, a second electrode coupled to the second semiconductor region and proximate the first electrode, wherein the second electrode is encircled by the first electrode. A third electrode may be coupled to the first electrode and the second semiconductor region. A fourth electrode may be coupled to the first semiconductor region and proximate the third electrode, wherein the fourth electrode may be coupled to the second electrode, and wherein the third electrode includes a shared portion of the first electrode.

20 Claims, 6 Drawing Sheets

SEMICONDUCTOR DEVICE WITH AN ENCIRCLED ELECTRODE

TECHNICAL FIELD

Embodiments of the subject matter described herein relate generally to semiconductor devices, including diodes.

BACKGROUND

Semiconductor devices find application in a wide variety of electronic components and systems. Useful semiconductor devices for radio frequency (RF) and high-speed switching and control applications include p-i-n diodes, p-n diodes, Schottky diodes, and related devices. In particular, p-i-n diodes are useful in high frequency and high-power rectifier applications because of their low capacitance, high breakdown voltage, and tune-able capacitance range. These diode devices act as bias-controlled capacitors/resistors and find applications as RF switches, phase shifters, and limiters. In these and other applications for these devices, there is a need for reduced device resistance. Reduced device resistance is important for reduced switching losses and improved frequency response for these applications. Thus, semiconductor devices, including p-i-n diodes, with reduced resistance are desired.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

Figure 1:
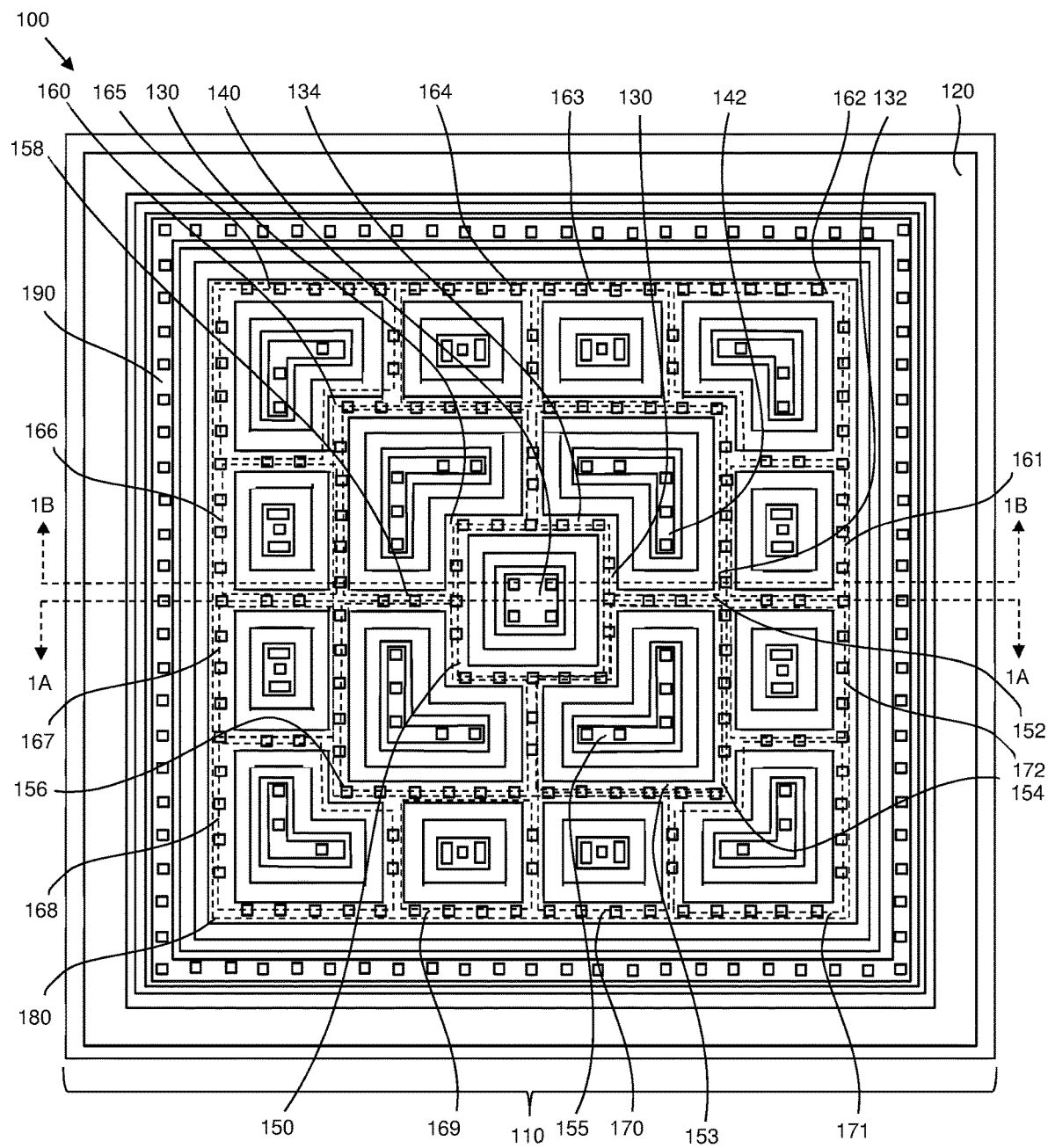
FIG. 1 is a top view of a semiconductor device in accordance with an embodiment.

FIG. 1 is a top view of a semiconductor device 100 in accordance with an embodiment. In an embodiment, the semiconductor device 100 may include a semiconductor substrate 110, an isolation region 120 formed within the semiconductor substrate 110, a first anode 130 ("first electrode") coupled to the semiconductor substrate 110, and a first cathode 140 ("second electrode") coupled to the semiconductor substrate 110 and the first anode 130. In an embodiment, the first anode 130 may encircle the first cathode 140. As used herein, the term "encircle" means to surround an electrode means to that an electrode (e.g. first anode 130) and/or the portion of the semiconductor substrate 110 in contact with the electrode (e.g. first anode 130) surrounds an electrode (e.g. first cathode 140). In an embodiment, the encircling of a cathode (e.g. first cathode 140) with an anode (e.g. first anode 130 or vice versa) may minimize the area of the isolation region (e.g. isolation region 120) needed and thus minimizes the die area consumed by semiconductor device 100. The first anode 130 may be coupled to a second anode 132 ("third electrode"), according to an embodiment. In an embodiment, the first anode 130 may include a ring that encircles the first cathode 140. In an embodiment, a second cathode 142 ("fourth electrode") may be coupled to the second anode 132. In an embodiment, the first anode 130 and the second anode 132 may abut one another in a shared anode portion 134 ("shared portion"). Moreover, in an embodiment, it may be desirable to maintain a constant distance between electrodes of opposite polarity (e.g. anode and cathode) to minimize the spreading resistance between the electrodes.

To reduce the resistance of the semiconductor device 100 while maintaining a low capacitance to achieve suitable isolation during operation (e.g. when embodiment of the semiconductor device 100 is a diode in the off state), it may desirable to break up the regions of the semiconductor device 100 into multiple segments, according to an embodiment. In an embodiment, the first and second anodes 130 and 132 and the first and second cathodes 140 and 142 may be arranged in a primary sub-cell 150 ("first sub-cell") and a secondary sub-cell 152 ("second sub-cell"). The primary sub-cell 150 may include the first anode 130 (i.e. first electrode) and the first cathode 140 (i.e. second electrode) that is encircled by the first anode 130. The secondary sub-cell 152 may include the second anode 132 (i.e. third electrode), and the second cathode 142 (i.e. fourth electrode). In an embodiment, the primary sub-cell 150 may be configured as an inner ring and the secondary sub-cell 152 may be configured as a portion of an outer ring that encircles the primary sub-cell 150. In an embodiment, the secondary sub-cell may include the shared anode portion 134 that includes a portion of the first anode 130.

According to embodiment, the primary sub-cell 150 may abut the first secondary sub-cell 152 and second, third, and fourth secondary sub-cells 154, 156, and 158 to form a first cell ring 160 ("first cell"). In an embodiment, the second secondary sub-cell 154 may include a third anode 153 ("fifth electrode") and a third cathode 155 ("sixth electrode"). The third and fourth secondary sub-cells 156 and 158 may be configured with electrodes (e.g. anodes and cathodes) in a manner similar to that of the primary sub-cell 150 and the second secondary sub-cell 152. In an embodiment, the semiconductor device 100 may include a plurality of cell rings ("plurality of cells"). In an embodiment, the plurality of cell rings may include the first cell ring 160 and one or more additional sub-cells, wherein the primary sub-cell 150 and the first secondary sub-cell 152 may be included in a portion of the first cell ring 160. In an embodiment, the outer portions of the anodes of the first, second, third, and fourth secondary sub-cells 152, 154, 156, and 158 that form the perimeter of the first cell ring 160 may be abutted to first, second, third, fourth, fifth, sixth, seventh, and eighth tertiary sub-cells 161, 162, 163, 164, 165, 166, 167, 168, 169, 170, 171, 172. In an embodiment, the outer portions of first, second, third, fourth, fifth, sixth, seventh, and eighth tertiary sub-cells 161, 162, 163, 164, 165, 166, 167, 168, 169, 170, 171, and 172 may form the perimeter of a second cell ring 180 ("second cell"). Without departing from the scope of the inventive subject matter, successive cell rings (not shown) may be realized by abutting additional sub-cells (e.g. quaternary, quinary, and so on, not shown) around the perimeter of the second cell ring 180. In an embodiment, an exterior cathode 190 ("exterior electrode") may encircle the outermost cell ring (e.g. second cell ring 180).

Figure 1A:
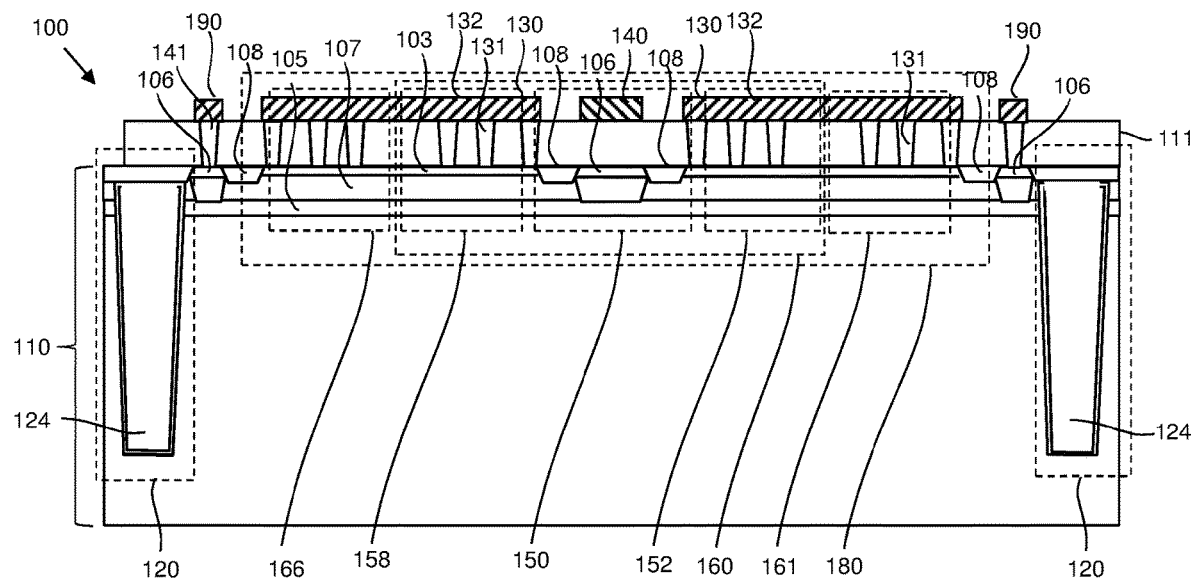
FIG. 1A is a cross sectional view of the semiconductor device of FIG. 1 along line 1A-1A, in accordance with an embodiment.
Figure 1B:
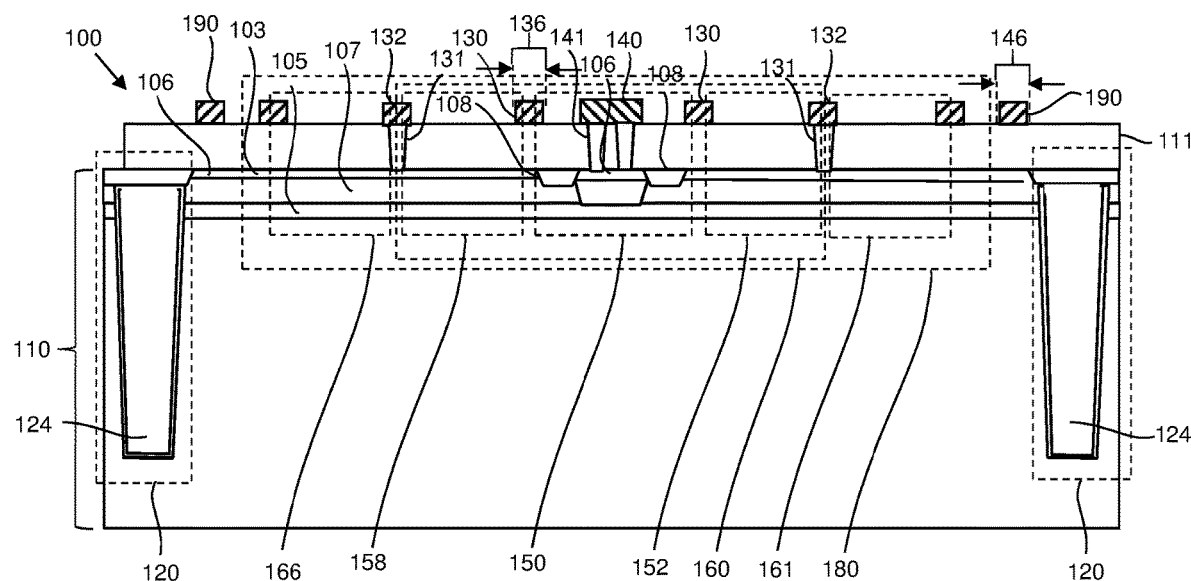
FIG. 1B is a cross sectional view of the semiconductor device of FIG. 1 along line 1B-1B, in accordance with an embodiment.

Referring simultaneously to FIG. 1 and the associated cross sections of FIG. 1 along cut lines 1A-1A and 1B-1B, as shown in FIGS. 1A and 1B, respectively, the semiconductor substrate 110 may include a number of semiconductor regions. As used herein, the term, "semiconductor region" may refer to single or multiple semiconductor regions that may include regions formed by implantation (e.g. ion implantation) or layers grown by epitaxial growth. In an embodiment, a first semiconductor region 103 may be formed within the semiconductor substrate 110. According to an embodiment, a second semiconductor region 105 may be formed within the semiconductor substrate 110 and adjacent the first semiconductor region 103. A third semiconductor region 107 may be formed between the first semiconductor region 103 and the second semiconductor region 105, according to an embodiment. According to an embodiment, the first semiconductor region 103 may be formed over the second semiconductor region 105. In an embodiment, the third semiconductor region 107 may formed between the first semiconductor region 103 and over the second semiconductor region 105.

In an embodiment, the semiconductor substrate 110 may include one or more of silicon (Si), germanium (Ge), gallium arsenide (GaAs), gallium phosphide (GaP), indium gallium phosphide (InGaP), indium phosphide (InP), gallium nitride (GaN), aluminum nitride (AlN), indium nitride (InN), silicon carbide (SiC), sapphire, or other suitable materials. In other embodiments, the semiconductor substrate 110 may include Si on insulator (SOI). In an embodiment, the first, second, and third semiconductor regions 103, 105, and 107 may include one or more of Si, Ge, and silicon germanium (SiGe). In other embodiments, the first, second, and third semiconductor regions 103, 105, and 107 may include one or more of GaAs, GaN, AN, InN, InGaP, and/or other suitable materials. In an embodiment, the first semiconductor region 103 may include a p-type semiconductor, the second semiconductor region 105 may include an n-type semiconductor, and the third semiconductor region 107 may include an intrinsic semiconductor. As used herein, the term "p-type semiconductor" refers to a semiconductor material with a hole concentration ranging from about $10^{15}$ cm$^{-3}$ to about $10^{20}$ cm$^{-3}$, though other higher or lower electron concentrations may be included. As used herein, the term "n-type semiconductor" refers to a semiconductor material with a net electron concentration ranging from about $10^{15}$ cm$^{-3}$ to about $10^{20}$ cm$^{-3}$, though other higher or lower electron or hole concentrations may be included. As used herein, the term "intrinsic semiconductor" refers to a semiconductor material with an electron or hole concentration ranging from about $10^{13}$ cm$^{-3}$ to about $10^{16}$ cm$^{-3}$, though other higher or lower electron or hole concentrations may be included. In an embodiment, one or more of the first, second, and third semiconductor regions 103, 105, and 107 may intentionally doped. In other embodiments, one or more of the first, second, and third semiconductor regions 103, 105, and 107 may un-intentionally doped. In some embodiments, the first semiconductor region 103 may include an intentionally doped p-type semiconductor, the second semiconductor region 105 may include an intentionally doped n-type semiconductor, and the third semiconductor region 107 may include an unintentionally-doped or lightly-doped intrinsic semiconductor. In other embodiments, the first semiconductor region 103 may include an intentionally doped n-type semiconductor, the second semiconductor region 105 may include an intentionally doped p-type semiconductor, and the third semiconductor region 107 may include an unintentionally-doped or lightly-doped intrinsic semiconductor. In an embodiment, one or more of the first, second, and third semiconductor regions 103, 105, and 107 may include implanted regions (i.e. doped by ion implantation) formed in the semiconductor substrate 110. Without departing from the scope of the inventive subject matter, one or more of the first, second, and third semiconductor regions 103, 105, and 107 may include epitaxially grown semiconductor layers.

In an embodiment, the first semiconductor region 103 may have a thickness of between about 100 angstroms and 1000 angstroms. In other embodiments, the first semiconductor region 103 may have a thickness between about 50 angstroms and about 5000 angstroms, though other thicknesses may be used. In an embodiment, the second semiconductor region 105 may have a thickness of between about 100 angstroms and 1000 angstroms. In other embodiments, the second semiconductor region 105 may have a thickness between about 50 angstroms and about 10000 angstroms, though other thicknesses may be used. In an embodiment, the third semiconductor region 107 may have a thickness of between about 100 angstroms and 1000 angstroms. In other embodiments, the third semiconductor region 107 may have a thickness between about 50 angstroms and about 5000 angstroms, though other thicknesses may be used. Referring again to FIGS. 1, 1A, and 1B, and in an embodiment, the anodes (e.g. first and second anode 130 and 132 as well as other anodes) may include a top conductive layer that is coupled to the first semiconductor region 103. In an embodiment, the top conductive layer may be formed from one or more of poly-silicon, aluminum (Al), copper (Cu), tungsten (W), titanium (W), gold (Au), or other suitable electrically conducting materials. In an embodiment, an anode length 136 used to form first, second anodes 130, 132, and other anodes may between about 0.1 microns and about 0.5 microns. In other embodiments, the anode length 136 may be between about 0.1 microns and about 10 microns. In an embodiment, the first contact vias 131 may couple one or more anodes (i.e. first anode 130, second anode 132, etc.) to the first semiconductor region 103 (e.g. p-type semiconductor). In an embodiment, the first contact vias 131 may be formed in an inter-layer dielectric 111 formed over the first semiconductor layer and may be filled with one or more of W, Cu, Al, Ti, Au, or other suitable conductive materials.

Referring again to FIGS. 1, 1A, and 1B, the cathodes (e.g. first and second cathodes 140 and 142 as well as other cathodes) may include a top conductive layer that is coupled to the second semiconductor region 105. In an embodiment, the top conductive layer may be formed from one or more of poly-silicon, Al, Cu, W, Ti, Au, or other suitable electrically conducting materials. In an embodiment, the cathodes (e.g. first and second cathodes 140 and 142) may be coupled to a common potential or connection point (not shown). In an embodiment, a cathode length 146 used to form, e.g., the second cathode 142, the exterior cathode 190, and other cathodes may between about 0.1 microns and about 0.5 microns. In other embodiments, the cathode length 146 may be between about 0.1 microns and about 10 microns. A second semiconductor contact region 106 (e.g. heavily doped n+ semiconductor region) may couple one or more cathodes (i.e. first cathode 140, second cathode 142, etc.) to the second semiconductor region 105 (e.g. n-type semiconductor), according to an embodiment. In an embodiment, one or more shallow isolation region(s) 108 may isolate portions of the first semiconductor region 103 from the second semiconductor contact region(s) 106. In an embodiment, the shallow isolation regions 108, may include ion implanted regions wherein damage to the crystal structure renders these regions substantially semi-insulating or highly resistive.

Referring again to FIGS. 1, 1A, and 1B, and in an embodiment, the isolation region 120 may be formed within the semiconductor substrate 110 to electrically isolate the semiconductor device 100 from other devices formed over or within the semiconductor substrate 110. According to an embodiment, the isolation region 120 may include any region formed within or over the semiconductor region 110 that substantially isolates the semiconductor device 100 from other devices within the semiconductor substrate 110. As used herein, the term "isolates" means to prevent or substantially limit electrical coupling, mechanical coupling, or other coupling between devices. In an embodiment, the isolation region 120 may include deep trench isolation (DTI) wherein an etched portion 124 of the semiconductor substrate 110 is removed (e.g. by dry etching) and then filling the etched portion 124 with an insulating or highly resistive material (e.g. silicon dioxide, silicon nitride, poly Si, or Si) to form the isolation region 120. In some embodiments, the etched portion 124 may include a doped layer (e.g. p-type layer) to enhance the isolation properties of the isolation region 120. In other embodiments, the isolation region 120 may include implanted regions of the semiconductor substrate 110.

Referring again to FIGS. 1, 1A, and 1B, the first anode 130 (i.e. first electrode) may be coupled to the first cathode 140 (i.e. second electrode) through the p-i-n junction formed by the electrical coupling of the first semiconductor region 103 (e.g. p-type layer), the third semiconductor layer 107 (intrinsic layer), and the second semiconductor layer 105 (n-type layer). According to an embodiment, the second anode 132 (i.e. third electrode) may be coupled to the first anode 130 by a common connection (e.g. metal or other highly conducting material). In an embodiment, the first anode 130 may be coupled to the second cathode 142 (i.e. fourth electrode) through the p-i-n junction in the first, second, and third semiconductor regions 103, 105, and 107, respectively. In an embodiment, the first anode 130 may include one or more segments and may be coupled to the first semiconductor region 103 (e.g. p-type semiconductor) through one or more first contact vias 131 coupled to the first semiconductor region 103 within the semiconductor substrate 110. According to an embodiment, the first cathode 140 may be coupled to the second semiconductor region 105 (e.g. n-type semiconductor) through a second contact vias 141 coupled to the second semiconductor region 105. In an embodiment, the second contact vias 141 may be coupled to the second semiconductor layer 105 through the second semiconductor contact region 106. In an embodiment, the first anode 130 may encircle the first cathode 140. The second anode 132 may be coupled to the first semiconductor region 103 (e.g. p-type semiconductor) and directly adjacent and coupled to the first anode 130, according to an embodiment. In an embodiment, the second cathode 142 may be coupled to the second semiconductor region 105 (e.g. n-type semiconductor) and directly adjacent the second anode 132. As used herein, the term "directly adjacent" means that two elements are adjacent and there are no intervening elements between the two adjacent elements. In an embodiment, the second anode 132 may include a shared anode portion 134 that includes a portion of the first anode 130. In an embodiment, the first and second anodes 130 and 132 may be coupled to the first semiconductor region 103 with first contact vias 131. Likewise, the first and second cathodes 140 and 142 may be coupled to the second semiconductor region 105 with the second contact vias 141.

Figure 2:
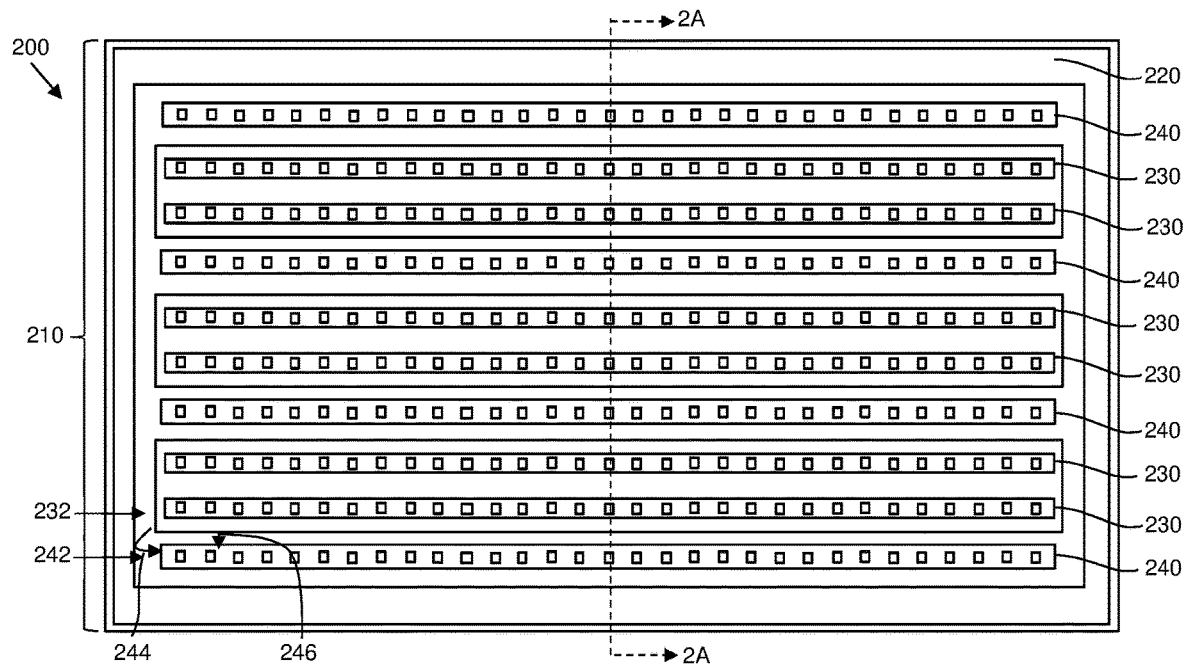
FIG. 2 is a top view of a conventional device.
Figure 2A:
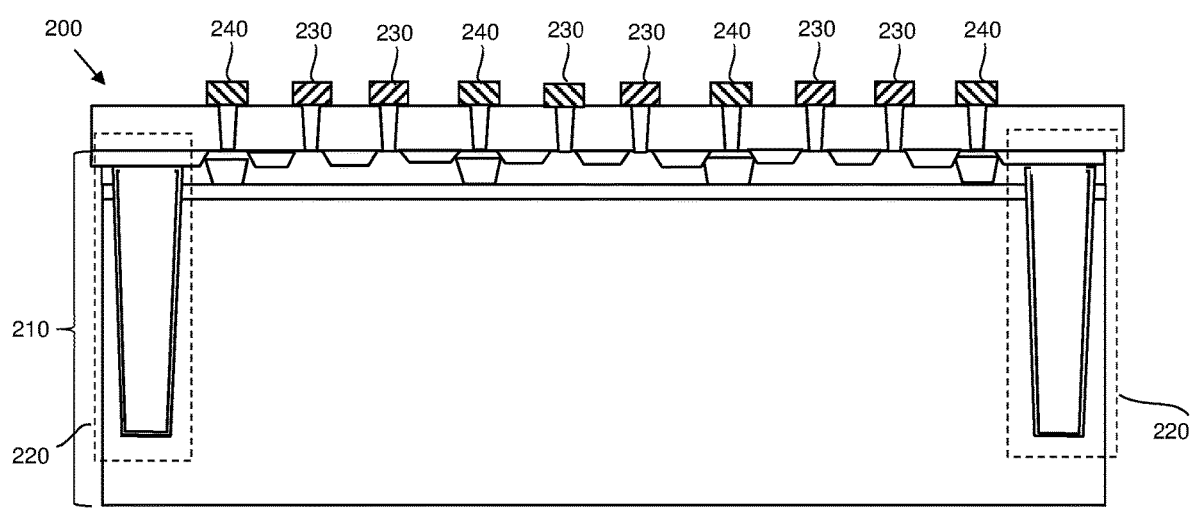
FIG. 2A is a cross sectional view of the conventional device of FIG. 2 along line 2A-2A.

FIG. 2 is a top view of a conventional device 200 shown for comparison to the semiconductor device 100 of FIG. 1. FIG. 2A is a cross sectional view of the conventional device 200 of FIG. 2 along line 2A-2A. In an embodiment, and referring simultaneously to FIGS. 2 and 2A, the conventional device 200 may include a semiconductor substrate 210, an isolation region 220 formed within the semiconductor substrate 210, anodes 230 coupled to the semiconductor substrate 210, and cathodes 240 coupled to the semiconductor substrate 210 and the anode 230. The semiconductor substrate 210 may contain the same features and is analogous to semiconductor substrate 110 of FIGS. 1, 1A, and 1B. The anodes 230 and the cathodes 240 of the conventional device 200 are arranged so that the anodes 230 and the cathodes 240 are parallel to each other and, unlike the semiconductor device 100 of FIG. 1, the anodes 230 do not encircle the cathodes 240. Thus, there is a non-constant distance between the anodes 230 and the cathodes 240 at the end point 232 of the anodes 230 and end point 242 of the cathodes 240. The extra distance between anodes 230 and cathodes 240 may cause additional spreading resistance between the anodes 230 and the cathodes 240 because of the longer end current path 244 at the end point 242 compared to the shorter interior current path 246. As will be shown in FIGS. 4-7, this increased spreading resistance results in higher insertion loss and reduced isolation for the conventional device 200 compared to the semiconductor device 100. The anodes 230 form rectifying junctions with the cathodes 240. The anodes 230 may be coupled to a p-type semiconductor region and the cathodes 240 may be coupled to an n-type semiconductor region. Both the n-type semiconductor region and the p-type semiconductor region are coupled to an intrinsic semiconductor region (e.g. lightly doped n-type region), according to an embodiment. The coupling of the series of anodes 230 and cathodes 240 to the n-type and p-type semiconductor regions within the semiconductor substrate 210 are analogous to the connections of the first anode 130 and first cathode 140 to the semiconductor substrate 110 of FIGS. 1 and 1A, for the sake of brevity, are not repeated here.

Figure 3:
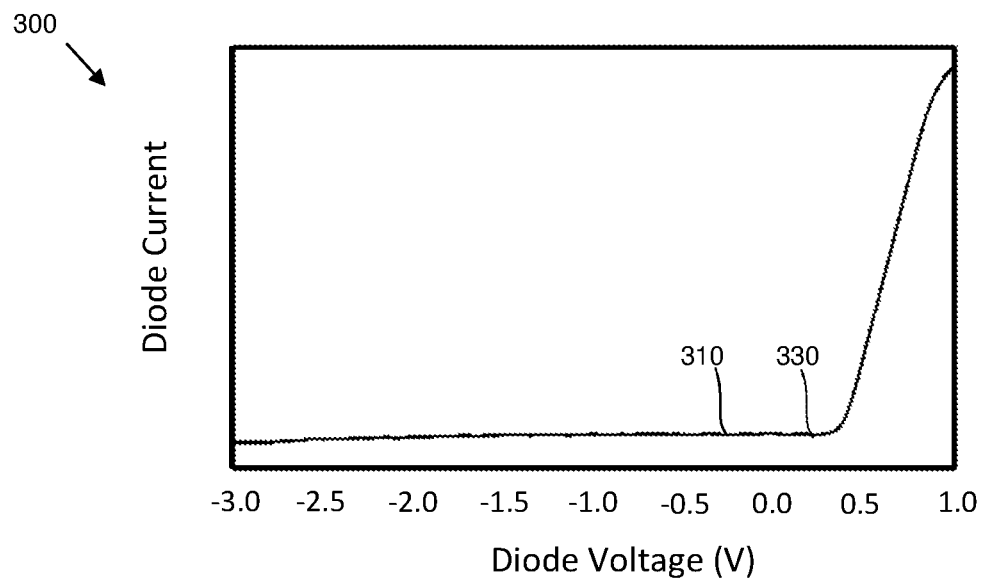
FIG. 3 is a chart of diode current versus diode voltage for the semiconductor devices of FIGS. 1 and 2.

FIG. 3 depicts a chart 300 of diode current versus diode voltage for the semiconductor device 100 of FIG. 1 and the conventional device 200 of FIGS. 1 and 2. Trace 310 is a graphical representation of the measured current versus diode voltage for the semiconductor device 100 of FIG. 1. Trace 330 is a graphical representation of the measured diode current for the conventional device 200 of FIG. 2. As seen in chart 300, comparison of traces 310 and 330 show that the semiconductor device 100 of FIG. 1 and the conventional device 200 have nearly identical diode current versus diode voltage characteristics. The nearly identical diode current versus diode voltage characteristics seen in the comparison of traces 310 and 330 results from semiconductor device 100 and conventional device 200 having equivalent areas.

Figure 4:
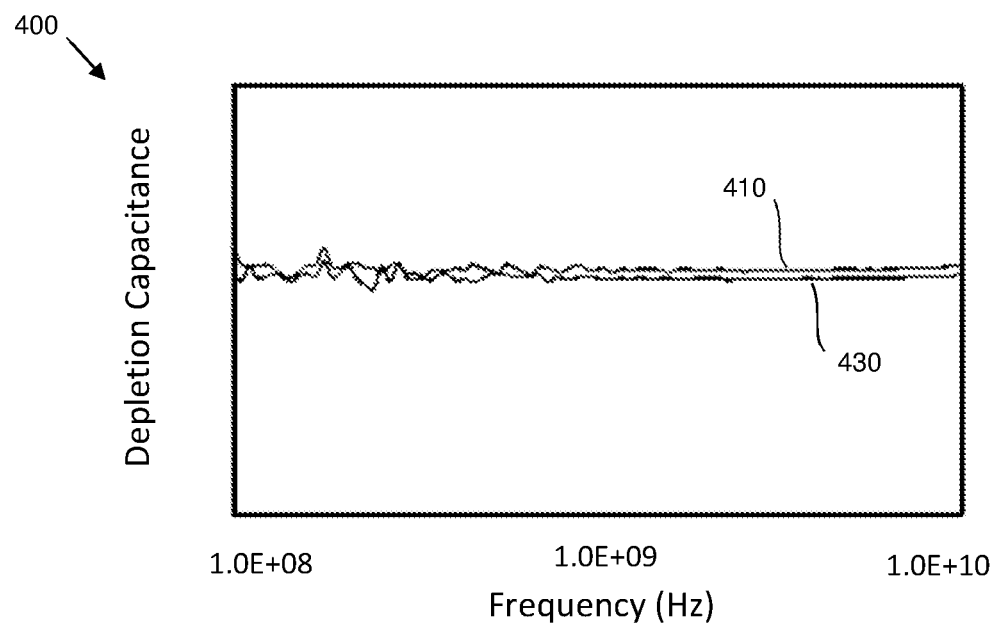
FIG. 4 is a chart of depletion capacitance versus frequency for the semiconductor devices of FIGS. 1 and 2.

FIG. 4 depicts a chart 400 of example depletion capacitance versus frequency in hertz for the semiconductor device 100 of FIG. 1 and the conventional device 200 of FIG. 2. Trace 410 is a graphical representation of the measured depletion capacitance versus frequency for the semiconductor device 100 of FIG. 1. Trace 430 is a graphical representation of the measured depletion capacitance versus frequency the conventional device 200 of FIG. 2. The measurements represented in trace 410 and in trace 430 are measurements of the capacitance of the diode at a reverse bias voltage of −2.5 volts, according to an embodiment. It should be appreciated that this data is exemplary and that wide variations in reverse bias voltages may be used, depending on the design of semiconductor device 100 and the voltage available in the application. According to an embodiment, the reverse bias for capacitance measurements may be set at about half of the breakdown voltage of a diode. Thus, in this example, the breakdown voltage is about −5 volts and hence the reverse bias voltage is set at −2.5 volts. In other examples (not shown), diodes with higher or lower breakdown voltage may be used. In these examples, higher or lower reverse bias voltages (e.g. half of the breakdown voltage) may be used. As seen in the chart 400, traces 410 and 430 show that the semiconductor device 100 and the conventional device 200 have nearly identical depletion capacitance characteristics. The nearly identical depletion capacitance versus frequency characteristics seen in the comparison of traces 410 and 430 results from the equivalent areas semiconductor device 100 of FIG. 1 and the conventional device 200 of FIG. 2.

Figure 5:
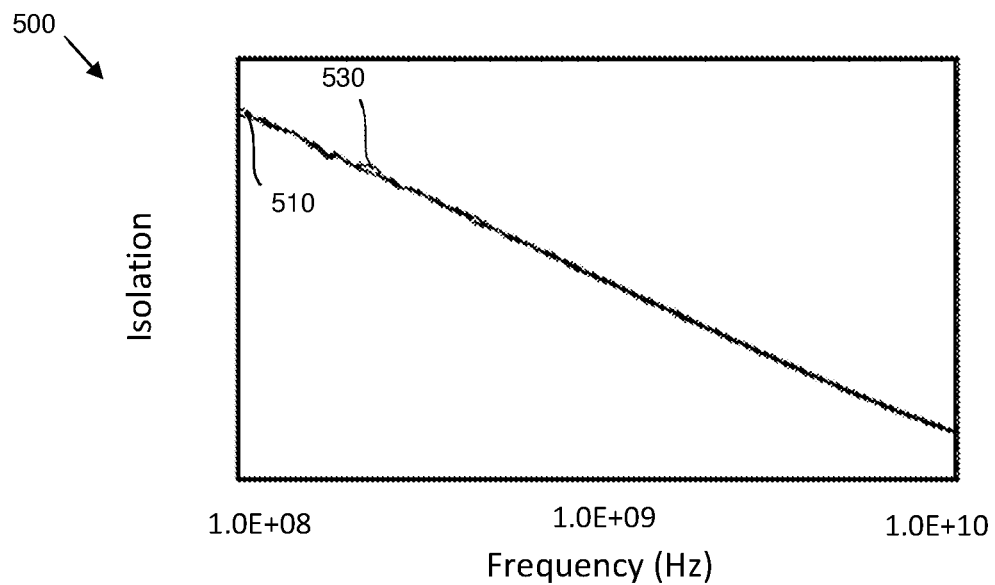
FIG. 5 is a chart of isolation versus frequency for the semiconductor devices of FIGS. 1 and 2.

FIG. 5 depicts a chart 500 of isolation versus frequency in hertz for the semiconductor device 100 of FIG. 1 and the conventional device 200 of FIG. 2. As used herein, the term "isolation" refers to ratio of an input power delivered to the device, when the device is "off" to the output power transmitted through a device in response to the input power delivered to the device. Ideally the isolation is infinite, meaning that that a signal does not pass through the device (e.g., semiconductor device 100). In an embodiment, the isolation is measured when the device (e.g. semiconductor device 100) is off, e.g. in a reverse bias condition (i.e. when the switch is off). Trace 510 is a graphical representation of the measured isolation versus frequency in hertz for the semiconductor device 100 of FIG. 1. Trace 530 is a graphical representation of the measured isolation versus frequency for the conventional device 200 of FIG. 2. The measurements represented in trace 510 and in trace 530 are measurements of the isolation diode at a reverse bias voltage of −2.5 volts. As seen in chart 500, traces 510 and 530 show that the semiconductor device 100 of FIG. 1 and the conventional device 200 of FIG. 2 have approximately identical isolation versus frequency characteristics. The approximately identical isolation versus frequency characteristics seen in the comparison of traces 510 and 530 arise from the nearly equivalent depletion capacitance of semiconductor device 100 of FIG. 1 and the conventional device 200 of FIG. 2.

Figure 6:
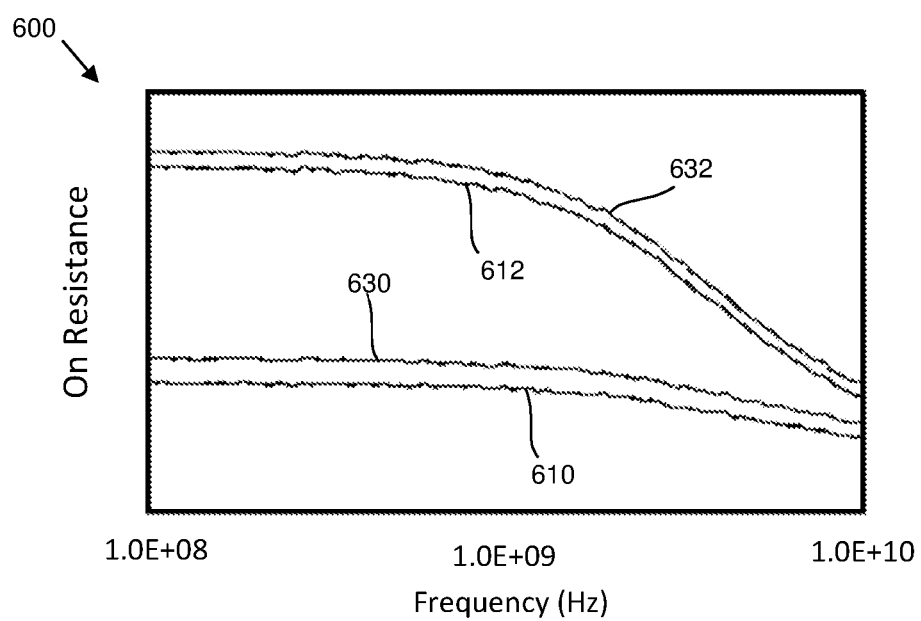
FIG. 6 is a chart of on-resistance versus frequency for the semiconductor devices of FIGS. 1 and 2.

FIG. 6 depicts a chart 600 of on-resistance versus frequency in hertz for the semiconductor device 100 of FIG. 1 and the conventional device 200 of FIG. 2. As used herein, the term "on-resistance" refers to the ratio of the radio frequency (RF) voltage to the RF current of a device. Traces 610 and 612 are graphical representations of the measured on-resistance versus frequency for the semiconductor device 100 of FIG. 1. In an embodiment, trace 610 represents the on-resistance for a forward bias voltage of 0.9 volts and trace 612 represents the on resistance for a forward bias voltage of 0.8 volts. Likewise, traces 630 and 632 are graphical representations of the measured on-resistance versus frequency in hertz for the conventional device 200 of FIG. 2. In an embodiment, the measurements represented in traces 630 and 632 are measurements of the on-resistance at forward bias voltages of 0.9 volts and 0.8 volts, respectively. As seen in chart 600, traces 610, 612, 630, and 632 show that the semiconductor device 100 of FIG. 1 has a lower on-resistance versus frequency than the conventional device 200 of FIG. 2 in both the on-state conditions. The lower on-resistance versus frequency characteristics observed for the semiconductor device 100 of FIG. 1 represented by traces 610 and 612 compared to the on resistance versus frequency represented by traces 630 and 632 for the conventional device 200 of FIG. 2 arises from the lower spreading resistance realized by the semiconductor device 100 of FIG. 1 compared to the conventional device 200 of FIG. 2.

Figure 7:
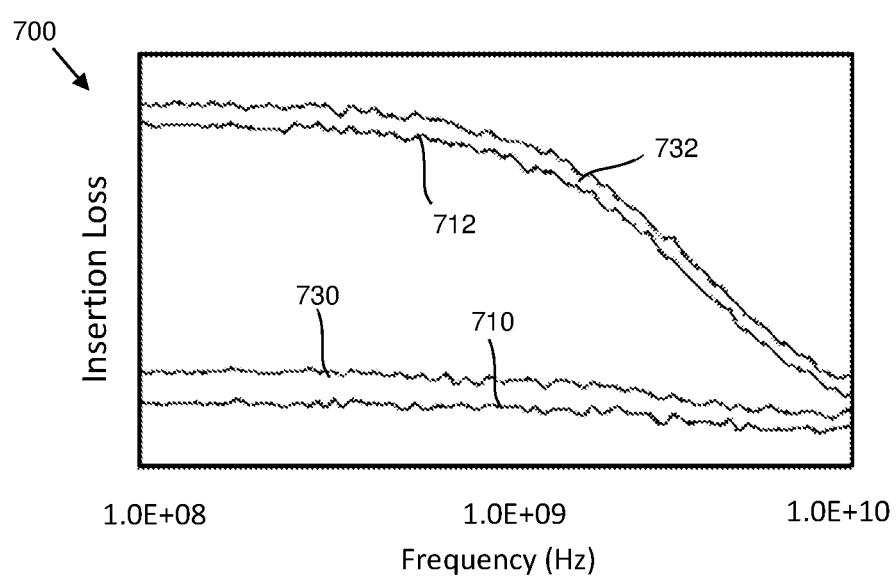
FIG. 7 is a chart of insertion loss versus frequency for the semiconductor devices of FIGS. 1 and 2.

FIG. 7 is a chart 700 of insertion loss versus frequency in hertz for the semiconductor device 100 of FIG. 1 and the conventional device 200 of FIG. 2. As used herein, the term "insertion loss" refers to ratio of output power transmitted to a device in response to a given amount of input power delivered to a device when forward-biased in an "on" state. Traces 710 and 712 are respectively graphical representations of the measured insertion loss versus frequency for the semiconductor device 100 of FIG. 1 and the conventional device 200 of FIG. 2 in the on-state (forward biased), both biased at a bias voltage of 0.8 volts. Traces 730 and 732 are graphical representations of the measured insertion loss versus frequency for the conventional device 200 of FIG. 2 in the on-state (forward biased) at a bias voltage of 0.9 volts, respectively. As seen in chart 700, traces 710, 712, 730, and 732 show that the semiconductor device 100 of FIG. 1 has a lower insertion loss versus frequency than the conventional device 200 of FIG. 2 in both the 0.8 volts and 0.9 volts on-state conditions. Of note, and as can be seen in FIG. 3, both the semiconductor device 100 of FIG. 1 and the conventional device 200 of FIG. 2 may have substantially equal current at both 0.8 volts and 0.9 volts forward bias voltages since they are biased with the same voltage and have the same areas. Thus, for a given current, in an embodiment, the semiconductor device 100 may have improved insertion loss than the conventional device 200. Also, it should be appreciated that the measurements represented by traces 710, 712, 730, and 732 are exemplary and that other bias points could be used (not shown). Similar trends (i.e. lower insertion loss for semiconductor device 100 of FIG. 1) may be seen for these other bias points.

The lower insertion loss versus frequency characteristics observed for the semiconductor device 100 of FIG. 1 represented by traces 710 and 712 compared to the on resistance versus frequency represented by traces 730 and 732 for the conventional device 200 of FIG. 2 arises from the lower on-resistance realized by the semiconductor device 100 of FIG. 1 compared to the conventional device 200 of FIG. 2.

By now it should be appreciated that various embodiments of semiconductor devices have been disclosed. In a first aspect, an embodiment of a semiconductor device may include a semiconductor substrate, a first semiconductor region formed within the semiconductor substrate, a second semiconductor region formed within the semiconductor substrate, a first electrode coupled to the first semiconductor region; a second electrode coupled to the second semiconductor region and proximate the first electrode, wherein the second electrode is encircled by the first electrode, a third electrode, coupled to the first electrode and to the first semiconductor region, wherein the third electrode includes a shared portion of the first electrode, and a fourth electrode, coupled to the second semiconductor region, and proximate the third electrode, wherein the fourth electrode is coupled to the second electrode. In an embodiment, the first electrode may be configured as an anode, the second electrode may be configured as a cathode, the third electrode may be configured as an anode, and the fourth electrode may be configured as a cathode. In other embodiments, the first electrode may be configured as a cathode, the second electrode may be configured as an anode, the third electrode may be configured as a cathode, and the fourth electrode may be configured as an anode. The first semiconductor region may be formed in an upper portion of the semiconductor substrate and the second semiconductor region may be formed below the first semiconductor region, according to an embodiment. In an embodiment, the first semiconductor region may include a p-type semiconductor and the second semiconductor region may include an n-type semiconductor. In an embodiment, the first semiconductor region may include an n-type semiconductor and the second semiconductor region may include a p-type semiconductor. In an embodiment, a third semiconductor region may be formed between the first semiconductor region and the second semiconductor region. In an embodiment, the third semiconductor region may include an intrinsic semiconductor.

In an embodiment, the semiconductor device may include a first sub-cell and a second sub-cell, wherein at least a portion of the first sub-cell includes the first electrode and the second electrode, and wherein at least a portion of the second sub-cell includes the third electrode and the fourth electrode. In an embodiment, the semiconductor device may include a plurality of cells including at least a first cell and a second cell, wherein the first sub-cell and the second sub-cell are included in a portion of the first cell, wherein at least a third sub-cell is included in a portion of the second cell, wherein the third sub-cell includes a fifth electrode coupled to the second semiconductor region and a sixth electrode coupled to the first semiconductor region, wherein the first electrode of the third sub-cell includes a shared region of third electrode of the second sub-cell. The semiconductor device may include an exterior electrode that encircles at least one of the first and second cell, according to an embodiment. In an embodiment, the first electrode may be configured as ring that encircles the second electrode. In an embodiment, the second cell may be configured as a ring that encircles the first cell. In an embodiment, the semiconductor device may include an isolation region adjacent the exterior electrode. In some embodiments, the isolation region may include deep trench isolation. In other embodiments, the isolation region may include implant isolation. In an embodiment, the semiconductor substrate may include bulk silicon. In other embodiments, the semiconductor substrate may include silicon-on-insulator.

In another aspect, an embodiment of the inventive subject matter may include a semiconductor diode that includes a semiconductor substrate, an n-type semiconductor region formed within the semiconductor substrate, a p-type semiconductor region formed within the semiconductor substrate adjacent the n-type semiconductor region, a first sub-cell, and a second sub-cell. In an embodiment, the first sub-cell may include a first anode coupled to the p-type region, and a cathode coupled to n-type semiconductor region and proximate the first anode, wherein the first cathode is encircled by the first anode. In an embodiment, a second sub-cell may include a second anode coupled to the first anode and a second p-type semiconductor region, wherein the second anode includes a shared portion of the first anode and a second cathode, coupled to the n-type region and proximate the second anode, wherein the second cathode is coupled to the first cathode, and wherein the first sub-cell is formed adjacent the second sub-cell.

In another aspect, the inventive subject matter may include a semiconductor p-i-n diode that includes a silicon substrate, a p-type semiconductor region formed within the silicon substrate, an n-type semiconductor region formed adjacent the p-type semiconductor region, an intrinsic semiconductor region formed between the p-type semiconductor region and the n-type semiconductor region. An embodiment may include a first anode coupled to the p-type semiconductor region, a first cathode coupled to n-type semiconductor region and proximate the anode, wherein the first cathode is encircled by the first anode, a second anode coupled to the p-type semiconductor region, a second cathode, coupled to the n-type semiconductor region, and proximate the second anode, wherein a portion of the second anode includes the first anode, and an isolation region surrounding the first anode, the first cathode, the second anode, and the second cathode.

For the sake of brevity, conventional semiconductor fabrication techniques may not be described in detail herein. In addition, certain terminology may also be used herein for reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:
1. A semiconductor device comprising:
  a semiconductor substrate;
  a first semiconductor region formed within the semiconductor substrate;

a second semiconductor region formed within the semiconductor substrate;
a first electrode coupled to the first semiconductor region with a via;
a second electrode coupled to the second semiconductor region with a via and proximate the first electrode, wherein the second electrode is encircled by the first electrode;
a third electrode, coupled to the first electrode and to the first semiconductor region with a via, wherein the third electrode includes a shared portion of the first electrode; and
a fourth electrode, coupled to the second semiconductor region with a via, and proximate the third electrode, wherein the fourth electrode is coupled to the second electrode.

2. The semiconductor device of claim 1, wherein the first electrode is configured as an anode, the second electrode is configured as a cathode, the third electrode is configured as an anode, and the fourth electrode is configured as a cathode.

3. The semiconductor device of claim 1, wherein the first electrode is configured as a cathode, the second electrode is configured as an anode, the third electrode is configured as a cathode, and the fourth electrode is configured as an anode.

4. The semiconductor device of claim 1, wherein the first semiconductor region is formed in an upper portion of the semiconductor substrate and the second semiconductor region is formed below the first semiconductor region.

5. The semiconductor device of claim 1, wherein the first semiconductor region comprises a p-type semiconductor and the second semiconductor region comprises an n-type semiconductor.

6. The semiconductor device of claim 1, wherein the first semiconductor region comprises an n-type semiconductor and the second semiconductor region comprises a p-type semiconductor.

7. The semiconductor device of claim 1, wherein a third semiconductor region is formed between the first semiconductor region and the second semiconductor region.

8. The semiconductor device of claim 7, wherein the third semiconductor region comprises an intrinsic semiconductor.

9. The semiconductor device of claim 1, wherein the first electrode is configured as ring that encircles the second electrode.

10. The semiconductor device of claim 1, wherein the semiconductor device comprises a first sub-cell and a second sub-cell, wherein at least a portion of the first sub-cell includes the first electrode and the second electrode, and wherein at least a portion of the second sub-cell includes the third electrode and the fourth electrode.

11. The semiconductor device of claim 10, wherein the semiconductor device comprises a plurality of cells including at least a first cell and a second cell, wherein the first sub-cell and the second sub-cell are included in a portion of the first cell, wherein at least a third sub-cell is included in a portion of the second cell, wherein the third sub-cell includes a fifth electrode coupled to the second semiconductor region and a sixth electrode coupled to the first semiconductor region, wherein the fifth electrode of the third sub-cell includes a shared region of third electrode of the second sub-cell.

12. The semiconductor device of claim 11, wherein the second cell is configured as a ring that encircles the first cell.

13. The semiconductor device of claim 1, wherein the semiconductor substrate comprises bulk silicon.

14. The semiconductor device of claim 1, wherein the semiconductor substrate comprises silicon-on-insulator.

15. A semiconductor device comprising:
a semiconductor substrate;
a first semiconductor region formed within the semiconductor substrate;
a second semiconductor region formed within the semiconductor substrate;
a first electrode coupled to the first semiconductor region;
a second electrode coupled to the second semiconductor region and proximate the first electrode, wherein the second electrode is encircled by the first electrode;
a third electrode, coupled to the first electrode and to the first semiconductor region, wherein the third electrode includes a shared portion of the first electrode; and
a fourth electrode, coupled to the second semiconductor region, and proximate the third electrode, wherein the fourth electrode is coupled to the second electrode; wherein:
the semiconductor device comprises a first sub-cell and a second sub-cell;
at least a portion of the first sub-cell includes the first electrode and the second electrode region;
at least a portion of the second sub-cell includes the third electrode and the fourth electrode;
the semiconductor device comprises a plurality of cells including at least a first cell and a second cell;
the first sub-cell and the second sub-cell are included in a portion of the first cell;
at least a third sub-cell is included in a portion of the second cell;
the third sub-cell includes a fifth electrode coupled to the second semiconductor region and a sixth electrode coupled to the first semiconductor region, wherein the fifth electrode of the third sub-cell includes a shared region of third electrode of the second sub-cell; and
the semiconductor device comprises an exterior electrode that encircles at least one of the first and second cell.

16. The semiconductor device of claim 15, further comprising an isolation region adjacent the exterior electrode.

17. The semiconductor device of claim 16, wherein the isolation region comprises deep trench isolation.

18. The semiconductor device of claim 16, wherein the isolation region comprises implant isolation.

19. A semiconductor diode comprising:
a semiconductor substrate;
an n-type semiconductor region formed within the semiconductor substrate;
a p-type semiconductor region formed within the semiconductor substrate adjacent the n-type semiconductor region;
a first sub-cell comprising:
a first anode coupled to the p-type semiconductor region with a via; and
a first cathode coupled to the n-type semiconductor region with a via and proximate the first anode, wherein the first cathode is encircled by the first anode;
a second sub-cell comprising:
a second anode coupled to the first anode and a second p-type semiconductor region with a via, wherein the second anode includes a shared portion of the first anode; and a second cathode, coupled to the n-type semiconductor region with a via and proximate the second anode, wherein the second cathode is coupled to the first cathode; and wherein the first sub-cell is formed adjacent the second sub-cell.

20. A semiconductor p-i-n diode comprising:

a silicon substrate;

a p-type semiconductor region formed within the silicon substrate;

an n-type semiconductor region formed adjacent the p-type semiconductor region;

an intrinsic semiconductor region formed between the p-type semiconductor region and the n-type semiconductor region;

a first anode coupled to the p-type semiconductor region with a via;

a first cathode coupled to the n-type semiconductor region with a via and proximate the first anode, wherein the first cathode is encircled by the first anode;

a second anode coupled to the p-type semiconductor region with a via;

a second cathode, coupled to the n-type semiconductor region with a via, and proximate the second anode, wherein a portion of the second anode includes the first anode; and an isolation region surrounding the first anode, the first cathode, the second anode, and the second cathode.

* * * * *